United States Patent [19]
Herman

[11] 3,988,729
[45] Oct. 26, 1976

[54] DIFFERENTIAL PULSE CODE MODULATION

[75] Inventor: Calvin F. Herman, Houston, Tex.

[73] Assignee: The United States of America as represented by the Administrator of the National Aeronautics and Space Administration, Washington, D.C.

[22] Filed: Jan. 29, 1975

[21] Appl. No.: 545,283

[52] U.S. Cl. .................................. 340/347 DD
[51] Int. Cl.² ................................... H04L 3/00
[58] Field of Search ........................ 178/66–68; 340/347 DD, 172.5; 235/159; 360/40–44; 325/38 R, 38 B

[56] References Cited
UNITED STATES PATENTS

| | | |
|---|---|---|
| 3,648,265 | 3/1972 | Kobayashi .................... 340/347 DD |
| 3,708,748 | 1/1973 | Nassimbene .................. 340/347 DD |
| 3,810,111 | 5/1974 | Patel ............................. 178/68 |

*Primary Examiner*—Charles D. Miller
*Attorney, Agent, or Firm*—Marvin J. Marnock; John R. Manning; Marvin F. Matthews

[57] ABSTRACT

A new and improved differential pulse code modulation (DPCM) encoding and decoding method and apparatus which is capable of transmission with minimum bandwidth, is not affected by data transition density, requires no direct current (DC) response of the transmission link, and suffers from minimal ambiguity in resolution of the digital data.

7 Claims, 6 Drawing Figures 3,988,729

DIFFERENTIAL PULSE CODE MODULATION

ORIGIN OF THE INVENTION

The invention described herein was made by an employee of the United States Government and may be manufactured and used by or for the Government of the United States of America for governmental purposes without the payment of any royalties thereon or therefor.

BACKGROUND OF THE INVENTION

1. Field of the Invention

The present invention relates to communication by different pulse code modulation.

2. Description of the Prior Art

Prior art pulse code modulation techniques have suffered from one or more of several constraining conditions: a wide transmission bandwidth was required; a high transition density in the data was necessary; a direct current response in the transmission link was required; or, resolution of data ambiguity (i.e., whether a bit was digital 1 or 0 ) was unsatisfactory.

SUMMARY OF INVENTION

Briefly, the present invention provides a new and improved method and apparatus for differential pulse code modulation (DPCM) communication which is adapted for use in magnetic tape recorders in spacecraft and elsewhere, and in pulse code modulation communication links where higher data rates, higher synchronization reliability or reduced transmitting power is required.

The method and apparatus of the present invention require no communication system direct current (DC) response, require minimum system bandwidth; are insensitive to data transition density; and the encoded data contains no ambiguity.

Digital data present in a succession of data bit intervals are differentially encoded, according to the method and apparatus of the present invention, so that the information is transmitted as a differential change or lack of change of state of data levels at bit time transition points during successive data bit intervals. Specifically, the data to be sent are encoded by causing a transition in signal level changes between successive bit time transition points (i.e., a signal level change from logic 1 to logic 0 at a first bit time transition point, and no such change at the next successive transition point, or vice-versa) during successive data bit intervals in response to a first digital data level, which may be either digital 1 or digital 0, in the digital data being encoded. When the alternate digital data level from the first digital data level is present in the data being encoded, no transition in signal level changes between successive bit time transition points is present. The data so encoded is then transmitted, received and decoded in a decoder according to the present invention.

It is an object of the present invention to provide a new and improved method and apparatus for communication by differential pulse code modulation (DPCM).

DESCRIPTION OF PREFERRED EMBODIMENT

Figure 1:
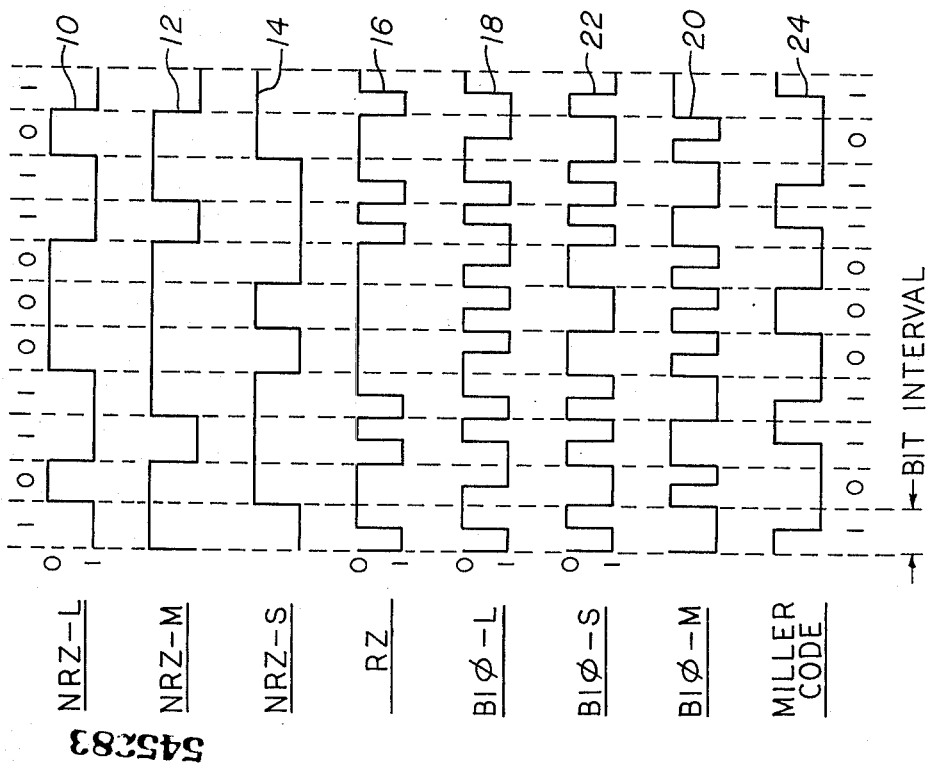
FIG. 1 is a signal waveform diagram of digital data signals encoded according to prior art encoding techniques.

As an aid to the explanation of the present invention set forth below, a description of prior art digital codes (FIG. 1) is set forth. A waveform 10 illustrates a type of prior art pulse code modulation (PCM) signal, formed in conventional apparatus, known as an NRZ-L level, NRZ-L, or NRZ change code or coding technique. The waveform 10 represents a digital 1 during a bit interval, as shown in the diagram as the space between successive slashed vertical lines, defined by clock pulses at a desired data pulse rate from a conventional data clock as a first data level for a duration of such bit interval, and a digital 0 as the other digital level for the duration of such bit interval. As is evident from the drawings, the waveform 10 represents a prior art NRZ-L signal formed in response to a typical sample data sequence of "10110001101" in consecutive bit intervals.

A waveform 12 illustrates another type of prior art PCM signal, formed in conventional apparatus, known as an NRZ-Mark or NRZ-M code. In this NRZ-M code, a digital 1 is represented by a change in level between consecutive bit intervals, and a digital 0 by no change in level between consecutive bit intervals. The waveform 12 represents a prior art NRZ-M signal formed in response to the same data sequence giving rise to the NRZ-L signal of waveform 10. A waveform 14 illustrates another type of prior art PCM signal, formed in conventional apparatus, known as an NRZ-Space or NRZ-S code. The NRZ-S code is the converse of the NRZ-M code, and consequently a digital 0 is represented by a change in level between consecutive bit intervals, and a digital 1 by no change in level between consecutive bit intervals. The waveform 14 represents a prior art NRZ-S signal formed in response to the same data sequence giving rise to the signal waveforms 10 and 12 previously set forth.

The NRZ encoding schemes, although widely in use, suffer from data ambiguity in that discrimination between a digital 1 and a digital 0 in the data is difficult to achieve in decoding. Further, these NRZ encoding schemes require a large number of evenly spaced bit transitions, as well as a system or communication link DC response for optimum system synchronization and performance.

The waveform 16 illustrates a type of prior art code known as a RZ code, formed in conventional apparatus. In the RZ code, a digital 1 is represented by a pulse for one-half of the data bit interval duration, while a digital 0 is represented by no pulse condition for the duration of the data bit interval. The waveform 16 represents a RZ code formed in response to the same data sequence giving rise to the waveforms 10, 12 and 14.

A waveform 18 represents still another type of prior art code known as a Bi-phase level, split phase or Manchester code. In the Bi-phase level, or Bi-φL, waveform 18 a digital 1 is represented by a pulse doublet 10 during a bit interval, while a digital 0 is represented by a pulse doublet 01 during the bit interval. The waveform 18 represents a prior art Bi-φL signal formed in response to the data sequence giving rise to the other encoded signals set forth above.

A waveform 20 illustrates another type of prior art code known as Bi-phase Mark, or Bi-φM. In the waveform 20, a transition occurs at the beginning of each bit interval, while a digital 1 is represented by no second transition during the bit interval. A digital 0 is represented by a second transition occurring at a bit time transition point one-half bit interval after the beginning of each bit interval. The waveform 20 represents a Bi-φM signal formed in response to the data sequence giving rise to the signals set forth above.

A waveform 22 illustrates another type of prior art code known as Bi-phase Space or Bi-φS, the converse of the Bi-φM. In the waveform 22, a transition occurs at the beginning of each bit interval, while a digital 0 is represented by no second transition during the bit interval. A digital 1 is represented by a second transition occurring one-half bit interval after the beginning of each bit interval.

The Bi-phase encoding techniques illustrated by the waveforms 18, 20 and 22, while offering optimum transition density insensitivity, in contrast to the NRZ coding scheme set forth above, require a wide data transmission bandwidth.

A waveform 24 illustrates yet another prior art digital code, known as a Miller code, in which a digital 1 is represented by a change in data levels at bit time transition points in the center of a data bit interval. A digital 0 is represented in the Miller code by no change in data levels in the center of the data bit interval, with a change in data levels at the end of the data bit interval between two successive digital 0 data bits. In order to maintain synchronization of the Miller code, a sequence of 101 must be repeatedly present in the data transmitted. With a high incidence of bit errors or a long time duration between synchronizing sequences in the Miller code, problems with loss of synchronization or signal acquisition often occur.

With the present invention, it has been found that digital data present in a succession of data bit intervals can be differentially encoded and substantially avoid the problems of the prior art encoding techniques set forth above. In accordance with the present invention, a transition in signal level changes is caused between successive bit time transition points occurring during successive data bit intervals in response to a first digital data level, and alternatively no transition in signal level changes between successive bit time transition points occurs in response to a second digital data level, so that the data is represented by the presence or absence of data level changes between successive bit time transitions during successive data bit intervals. Specifically, a first digital data level in a data bit interval is represented as a differential transition in data level changes between successive bit transition points in successive data bit intervals, such as a change from digital 1 to 0 data level at a first bit time transition point and no change in data level at the bit time transition point in the next successive bit interval. The second digital data level is represented by the absence of a differential transition in data level changes.

Since the code is differential, namely representing information by the presence or absence of change in signal level transitions between successive data bit intervals, it is not ambiguous in decoding. Further, the differential information representing a first digital data level, and the absence of such differential information representing the second digital data level, permits a half-bit rate clock signal, as will be set forth in detail below, to be transmitted as transitions between 0 bit times so that no direct current response is required and the spectral energy of the signal being transmitted is concentrated in a relatively narrow bandwidth.

The encoding of the present invention utilizes a 'MARK' code in which a transition in signal level changes between successive bit time transition points occurs in response to a digital 1 data level and no transition in signal level changes occurs in response to a digital 0 data level. Alternatively, the encoding technique of the present invention takes the form of a "SPACE" code, the converse of the "MARK" code, in which a transition in signal level changes between successive bit time transition points occurs in response to a digital 0 data level, and no transition in signal level changes occur in response to a digital 1 data level.

Figure 2:
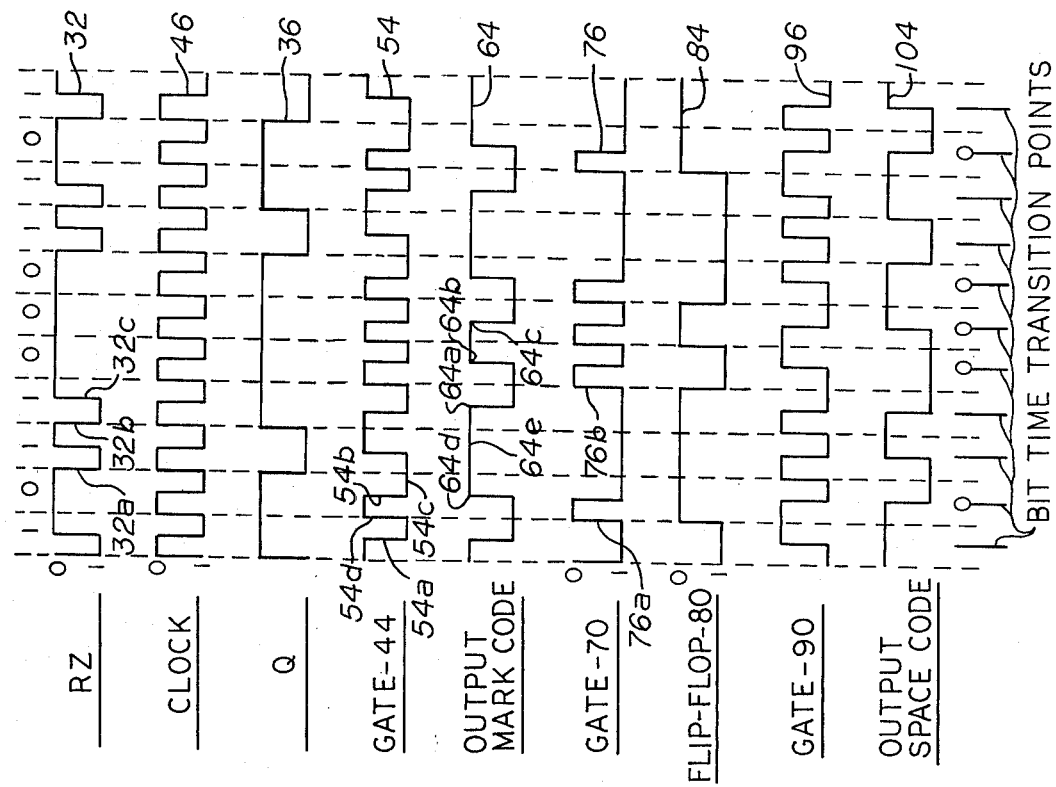
FIG. 2 is a signal waveform diagram of example signal waveforms present in the encoder of the present invention.
Figure 3:
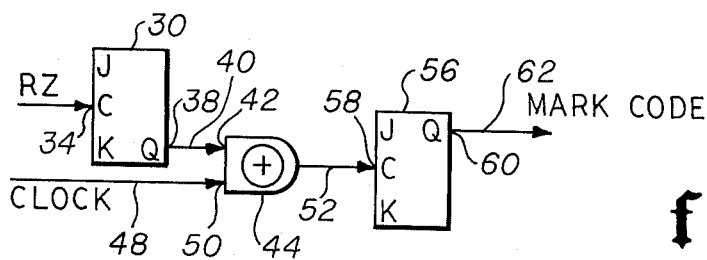
FIG. 3 is a schematic electrical circuit diagram a data encoder according to the present invention.

Considering now the apparatus of the present invention, an encoder E (FIG. 3) forms the "MARK" code. In the encoder E, a J-K flip-flop 30 receives incoming digital data as exemplified a waveform 32 (FIG. 2) in the form of prior art RZ digital code, formed in a conventional manner, at a clock or C input terminal 34 (FIG. 3). The flip-flop 30 converts the RZ data input to NRZ-M format by changing digital levels for each digital 1 input signal in response to the leading edge of the half-bit wide RZ 1 pulse, as indicated at 32a and 32b in the waveform 32, occurring at the beginning of each bit interval. The trailing edge, such as indicated at 32c, of the RZ data input does not cause the flip-flop 30 to change levels.

When a digital 0 RZ data format input signal is presented at the flip-flop 30, the constant level RZ coded 0 also does not cause the flip-flop 30 to change levels. Accordingly, the flip-flop 30 converts input RZ data to NRZ-MARK format wherein a digital 1 is represented as a signal level change at the beginning of a bit interval and a digital 0 by no such change.

The flip-flop 30 provides an output waveform 36 representing this function at a Q output terminal 38 over a conductor 40 to a first input 42 of an EXCLUSIVE OR gate 44.

The EXCLUSIVE OR gate 44 receives a CLOCK SIGNAL waveform 46 (FIG. 2) from a conductor 48 at an input terminal 50. The frequency of the clock signal waveform 56 is twice that of the digital RZ data to be encoded in the encoder E, defining the occurrence time for bit time transition points within the data bit intervals to be at substantially one-half the duration of the data bit intervals.

The EXCLUSIVE OR gate 44 forms an output signal of level 1 on an output conductor 52 when the input signals present at the input terminals 42 and 50 differ in logic levels from each other, as indicated by an output waveform 54. The clock input waveform 46 at twice the data rate or frequency of the input signal presents alternate logic levels as input signals to the gate 44 during the first and second halves of each data bit interval, changing levels at a bit time transition point midway in time through the data bit interval. Because of these alternate logic levels inputs at terminal 50, the output of EXCLUSIVE OR gate 44 changes level at each bit time transition point regardless of the input signal on conductor 40 from flip-flop 30.

When the output signal from flip-flop 30 changes at the beginning of a data bit interval in response to a digital 1 input in the manner set forth above, the clock waveform 46 by definition also changes levels so that the output of gate 44 does not change levels at the beginning of a bit interval in response to a digital 1 input to the encoder E. At the next bit time transition point, however, the output of gate 44 changes levels in response to the clock signal level change.

When the output signal from flip-flop 30 does not change at the beginning of a data bit interval in response to a digital 0 input, the clock waveform 46 changes levels and causes the output of gate 44 to also change levels. The output of gate 44 again changes levels at the bit time transition point in response to the clock waveform 46 level change, as has been set forth.

EXCLUSIVE OR gate 44 thus forms a Bi-phase Mark code, advanced in time one-half bit interval, since a signal level change occurs at each bit time transition point as is indicated at 54a and 54b, while no second level change occurs therebetween in response to a digital 1, as indicated at 54c. When a 0 input is present, as indicated at 54d, a level change also occurs at the beginning of the data bit interval for such 0 input.

An output encoder flip-flop 56 receives the waveform 54 at a clock or C input terminal 58, changing levels of output signal at a Q output terminal 60 in response to alternate level changes in the waveform 54. When these level changes in waveform 54 occur at twice the data rate, or at the frequency of the clock waveform 46, in response to digital 0 input, the flip-flop 56 provides output signal levels with successive, continuing level changes at each bit time transition point, as indicated at 64a, 64b and 64c. Thus, there is no differential transition from presence of a level change to absence of a level change between bit time transition points in successive bit intervals in response to a digital 0.

When the level changes in waveform 54 occur at the data rate in response to digital 1 input, the flip-flop 56 provides output signals from the encoder E with a differential transition (presence of level change to absence of level change) as indicated by the presence of a level change at 64d and absence of a level change at 64e between bit time transition points in successive bit intervals.

Thus, as is evident from inspection of the output MARK code waveform 64 and the input RZ waveform 32, the encoder E differentially encodes digital data present in a succession of data bit intervals in the input RZ data waveform 32 by causing a transition in signal level changes in response to a digital 1, namely a transition from presence of a level change to absence of a level change, or conversely from absence of a level change to presence thereof, between successive bit time transition points. As set forth above, the bit time transition points occur at times defined by the clock waveform 46 during successive bit data intervals. Similarly, as is evident from the waveform 64, the encoder E differentially encodes digital data by causing no transition in signal level changes between the successive bit time transition points in response to a digital 0, so that the data is represented by the presence or absence of data level changes between the successive bit time transitions during successive data bit intervals.

Figure 4:
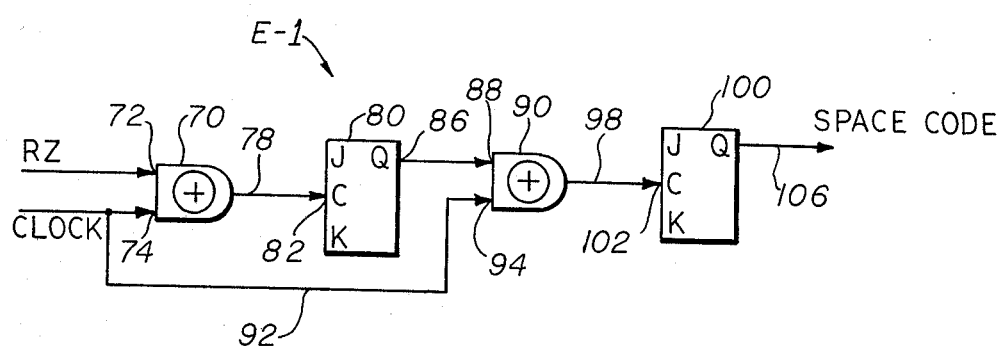
FIG. 4 is a schematic electrical circuit diagram of an alternate data encoder according to the present invention.

An encoder E-1 (FIG. 4) of the present invention forms the SPACE code and differentially encodes digital data present in successive data bit intervals by causing a transition in signal level changes between successive bit time transition points during successive data bit intervals in response to a digital 0, and by causing no transition in signal level changes between successive bit time transition points in response to a digital 1, forming a SPACE code, or converse of the MARK code formed in the encoder E.

Considering the encoder E-1 more in detail, an EXCLUSIVE OR gate 70 receives an input signal, such as the input RZ data waveform 32, at a first input terminal 72 thereof and a clock signal, such as the clock signal waveform 46, at a second input terminal 74, forming an output signal of logic level 1 for the duration of each data bit interval in response to a logic 1 input and passing the clock signal 46 therethrough in each data bit interval containing a logic 0. These signals are set forth as waveform 76 which is provided over a conductor 78 to a flip-flop 80 at a clock or C input terminal 82.

The flip-flop 80 responds to trailing edges, such as 76a and 76b, in the waveform 76 from the gate 70 and converts the input data into NRZ-Space format where a digital 0 is represented by a level change. The output of flip-flop 80 is provided as an output signal waveform 84 at a Q output terminal 86 to a first input terminal 88 of an EXCLUSIVE OR gate 90. The EXCLUSIVE OR gate 90 further receives the clock signal waveform 46 over a conductor 92 at an input terminal 94 thereof. The gate 90 forms an output signal of level 1 when the input signals differ from each other and of level 0 when the signals are of like level. The clock input signal on conductor 92 presents alternate logic levels to the gate 90 during alternate halves of the data bit intervals causing the voltage level of an output signal waveform 96 to change levels at bit time transition points.

When the output of flip-flop 80 changes level at the beginning of a data bit interval in response to a digital 0 input, the presence of this level change at input 88 to gate 90 and the simultaneous level change in the clock waveform at the input terminal 94 prevent the output signal from gate 90 from changing levels. However, when flip-flop 80 does not change levels due to a digital 1 input, the change in levels of the clock waveform at the input terminal 94 causes the output of gate 90 to change levels.

Gate 90 thus forms a signal which changes level at each bit time transition point midway through each data bit interval and identifies a digital 1 during a data bit interval by a transition at the start of such data bit interval, and a digital 0 by the absence of such a transition. The output of gate 90 is furnished over a conductor 98 to an output encoder flip-flop 100 at a clock or C input terminal 102. The output encoder flip-flop 100 changes signal levels in an output waveform 104 at a Q output terminal 106 in response to alternate level changes in the waveform 96. When these level changes in waveform 54 occur at the beginning of a data bit interval and at a bit time transition point successively, and thus at twice the data rate in response to a digital 1, the flip-flop 100 provides output signal levels in waveform 104 with successive, continuing level changes at each bit time transition point, as indicated at 104a and 104b, with no differential transition between presence of a level change to absence of a level change in response to a digital 1.

When the level changes in waveform 96 occur only at the data rate, at successive bit time transition points, the flip-flop 100 provides output signal levels in waveform 104 with differential transitions from presence of a level change to absence of a level change as, indicated by the presence of a level change at 104c and the absence of a level change at the next successive bit time transition point 104d. The output of flip-flop 100 is provided as an output SPACE code waveform 104 over a conductor 106 for subsequent transmission or use.

Thus, the encoder E-1 differentially encodes digital data present in a succession of data bit intervals in the input RZ data waveform 32 by causing a transition in signal level changes, as is evident from the waveform 104, between successive bit time transition points occurring during successive data bit intervals in response to a digital 0 and by causing no transition in signal level changes between successive bit time transition points in response to a digital 1.

Figure 5:
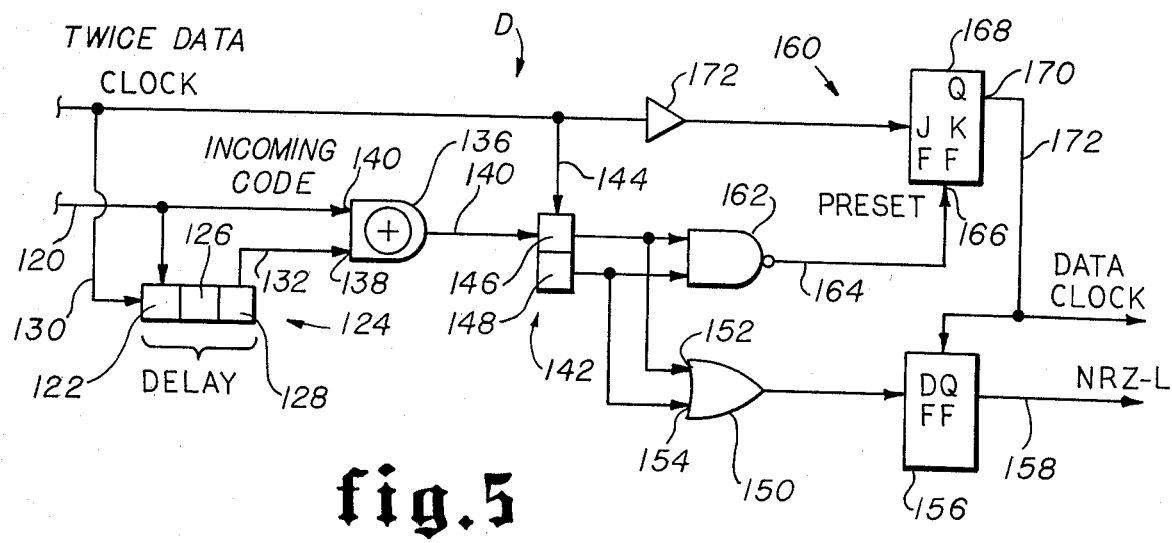
FIG. 5 is a schematic electrical circuit diagram of a data encoder adapted for decoding signals from the encoders of FIGS. 3 and 4.

After encoding in either the encoder E or the encoder E-1 of the present invention, the encoded data is transmitted through a conventional data transmitter and received at a conventional communication receiver for decoding in a decoder D (FIG. 5) of the present invention. The decoder D compares the received signal, as will be set forth below, for successive data bit intervals to determine the presence or absence of transitions in data level changes between successive bit time transition points and converts the received signal into the prior art NRZ-L data format of waveform 10 for subsequent processing, analysis or the like.

The decoder D is adapted to decode data encoded in both MARK code format by the encoder E (FIG. 3) and in SPACE code format in the encoder E-1 without requiring any modifications.

Figure 6:
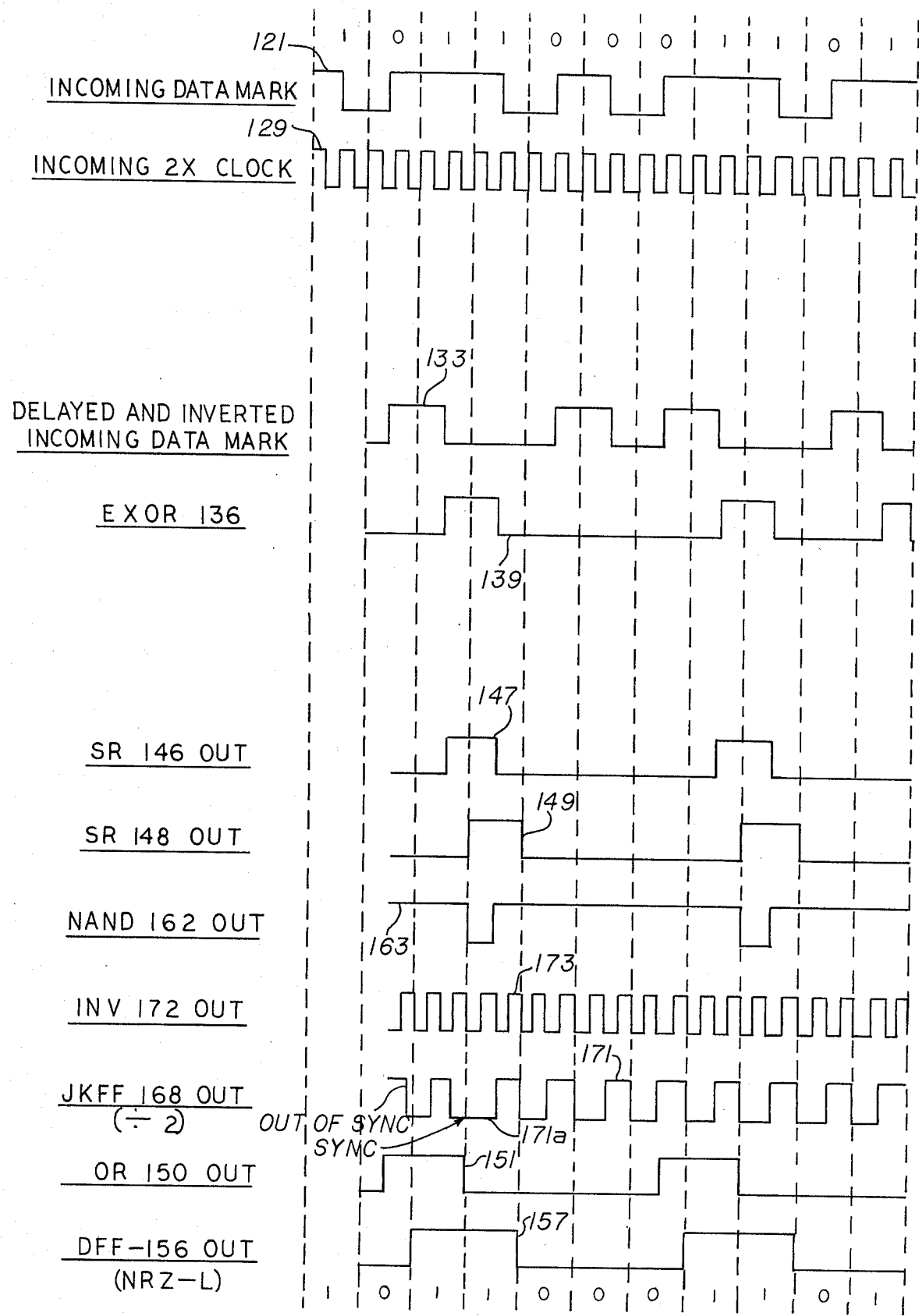
FIG. 6 is a signal waveform diagram of example signal waveforms present in the decoder of FIG. 5.

Considering the decoder D more in detail, incoming encoded data, as exemplified by a waveform 121 (FIG. 6), is received over an input conductor 120 at a first flip-flop 122 of a 3-stage storage register 124. The incoming encoded data is moved from the flip-flop 122 through the storage register 124, to a second flip-flop 126 and a third flipflop 128 of the storage register 124, by means of a clock pulse signal 129 present on a conductor 130. The clock pulse signal 129 on the conductor 130 is obtained from the incoming code signal by using conventional phase lock synchronization circuitry at twice the digital data rate. The clock signal present on the conductor 130 occurs at a rate corresponding to the rate of occurrence of the bit time transition points in the signal to be decoded in order to form comparison segments of the stored signal, representing the first and second halves of the data bit interval.

An output conductor 132 is electrically connected to an inverted output terminal or Q terminal of the third storage flip-flop 128 of the storage register 124, so that a signal waveform 133 present on the conductor 132 is the inverted version of the incoming encoded signal 121 during a comparison segment which was received two comparison segments previously on the conductor 120. Thus, the signal 121 and the signal 133 represent like comparison segments of successive data bit intervals.

The signal 133 is provided to an EXCLUSIVE OR monitoring gate 136 at an input terminal 138. The incoming code signal 121 is provided to the monitoring gate 136 at an input terminal 140. The monitoring gate 136 monitors the corresponding or like comparison segments of successive data bit intervals presented to it for differences in the signal levels to detect the presence or absence of transitions in data level changes between successive data bit intervals and provide an output waveform 139. The signal 133 is an inverted version of the received signal, as has been set forth, and thus when like signal levels are present in corresponding comparison segments, the signals presented to gate 136 differ and a logic 1 is formed for that portion of output signal 139. If corresponding comparison segments of successive data bit intervals differ in signal level an output logic 0 is formed in that portion of waveform 139 due to the inverted input of signal 133 present at the terminal 138.

The output signal 139 of the EXCLUSIVE OR gate 136 is provided over a conductor 140 to a two-stage storage register 142 which receives the clock signal 129 present on the conductor 130 over a conductor 144. The storage register 142 accordingly has storage capacity to accommodate the comparison results for the first and second halves of each successive data bit interval in the incoming signal in a first storage flip-flop 146 and a second storage flip-flop 148 thereof. The contents of the flip-flop 146 and 148 represent adjacent half bit period comparison samples for bit detection and bit clock synchronization. These contents are provided as output signals 147 and 149, respectively, for inputs to an OR gate 150 at input terminals 152 and 154, respectively. The signals 147 and 149 are also presented as inputs to a NAND gate 162.

The output signals 147 and 149 from the register 142 are used to perform two functions: first, code synchronization or clock pulse recovery in a clock pulse recovery circuit 160; and second, detection/conversion. The signals 147 and 149 are provided to NAND gate 162 for code synchronization and to OR gate 150 for detection/conversion.

Considering first the code synchronization function of the decoder D, the NAND gate 162 of the recovery circuit 160 compares the signals 147 and 149, representing time adjacent half bit period comparison samples.

For bit rate synchronization, the output of NAND gate 162 represents the occurrence of adjacent state transitions in the incoming signal 121. Such an occurrence of adjacent state transitions signifies the occurrence of the beginning of a bit time interval and therefore signifies bit synchronization. When the gate 162 detects adjacent state transitions, a logic 0 is provided in an output signal 163 over a conductor 164 to a PRESET input terminal 166 of a J-K flip-flop 168. Presence of a logic 0 in signal 163 at the input terminal 166 biases or presets the flip-flop 168 to a known condition by driving a Q output terminal 170 thereof to a logic 1 level for the duration of this one-half data bit interval or one comparison segment as indicated at a point 171a on waveform 171. The flip-flop 166 also received from an inverter 172 an input inverted clock signal 173 and divides the clock signal 173 by two, in a known relationship to the incoming code 121, established when PRESET signal 163 is logic 0 and present at the input terminal 166, in the manner set forth above, so that the clock frequency signal 130 is maintained in synchronism with the incoming code. The output 171 of flip-flop 168 is provided over a conductor 172 to a flip-flop 156 in the detection/conversion portion of the decoder D to move the decoded data 157 through the flip-flop 156 over a conductor 158 for subsequent use and processing.

The output signal 139 from the EXCLUSIVE OR gate 136 is stored in the two-stage shift register 142 for detection and conversion as well. Since the state of adjacent transitions between successive bit intervals, due to the encoding technique of the present invention, defines data content, data levels in both the first and second halves of successive bit intervals must be compared. Accordingly, the register 148 receives and stores, after one-half bit interval delay in register 146, the first half-bit comparison sample, as in signal 149 from gate 136, which register 146 stores the second half-bit comparison sample, as in signal 147.

These comparison samples are then provided at the input terminals 152 and 154, respectively, of OR gate 150, which form a logic 1 output in a signal 151 in response to detection of an adjacent change of transition states between successive bit intervals. The signal 151 is then sampled in the D flip-flop 156 at a rate defined by the clock signal 171, which has a known, unambiguous time relationship to the detected-delayed simultaneous samples presented as inputs to the OR circuit 150. The D flip-flop 156 thus provides as on output signal 157 over conductor 158 decoded data in NRZ-L format for further use, processing analysis and the like.

From the foregoing, it can be seen that the method and the apparatus of the present invention provide a differential pulse code modulation (DPCM) encoding and decoding method and apparatus. Since the code is differential in that the presence or absence of transitions in signal level changes between successive bit time transition points (e.g., a 1 is represented by a center of bit time transition change from bit-to-bit, a middle of bit time transition to no middle of bit time transition, or vice versa) no decoding ambiguity occurs. In the absence of information (e.g., no bit-to-bit change of center-of-bit time transition, a lack of transition), half bit rate clock is transmitted as the output of the encoder as transitions between the beginning of each successive data bit interval. Accordingly, the method and apparatus require no direct current response in the system and the spectral energy of the signal so transmitted is concentrated in a narrow frequency bandwidth.

Further, the encoding and decoding technique of the present invention eliminates sensitivity of the receiving system to transition density, since the presence or absence of transitions defines the data content, rather than the actual transitions that occur. Accordingly, with the encoding and decoding techinque of the present invention, system transmit power requirement are reduced, while system data handling capabilities are increased. Further, since the output encoded data transmits clock rate information directly, system synchronization reliability using the techniques of the present invention is increased.

The foregoing disclosure and description of the invention are illustrative and explanatory thereof, and various changes in the size, shape, materials, components, circuit elements, wiring connection and contacts as well as in the details of the illustrated circuitry and construction may be made without departing from the spirit of the invention.

I claim:

1. An apparatus for differentially encoding digital data present in a succession of data bit intervals, comprising:
   a. means for generating a clock signal defining the occurrence time for bit time transition points to be at substantially one-half the duration of the data bit intervals;
   b. means cooperative with said clock signal generating means for causing a transition in signal level changes between successive bit time transition points occurring during successive data bit intervals in response to a first digital data level; and
   c. means for causing no transition in signal level changes between successive bit time transition points in response to a second digital data level, whereby the data is represented by the presence or absence of data level changes between successive bit time transitions during successive data bit intervals.

2. An apparatus as described in claim 1 further including:
   means for receiving and decoding the encoded data, said means for decoding comprising
   circuitry means for comparing the received signal for successive data bit intervals to determine the presence or absence of transitions in data level changes between successive bit time transition points.

3. The apparatus of claim 2, wherein said circuitry means for comparing comprises:
   a. storage means for storing the received signal;
   b. means for moving the stored signal through said storage means at a rate corresponding to the rate of occurrence of bit time transition points to form comparison segments of the stored signal; and
   c. means for monitoring corresponding comparison segments of successive data bit intervals for differences in signal level to detect the presence or absence of transitions in data level changes.

4. The apparatus of claim 1, further including:
   means for recovering a clock signal defining the data bit intervals from the received signal.

5. The apparatus of claim 4, further including:
   a. means for storing the decoded data; and
   b. means for removing the decoded data from storage at the recovered clock signal rate.

6. The apparatus of claim 1, wherein:
   a. said means for causing a transition in signal level changes between successive bit time transition points comprises means for causing a transition in response to a digital 1 data level; and
   b. said means for causing no transition in signal level changes comprises means for causing no transition in response to a digital 0 data level.

7. The apparatus of claim 1, wherein:
   a. said means for causing a transition in signal level changes between successive bit time transition points comprises means for causing a transition in response to a digital 0 data level; and
   b. said means for causing no transition in signal level changes comprises means for causing no transition in response to a digital 1 data level.

* * * * *